United States Patent
Lim et al.

(10) Patent No.: US 8,395,266 B2
(45) Date of Patent: Mar. 12, 2013

(54) SEMICONDUCTOR MEMORY DEVICE

(75) Inventors: Kwan-Yong Lim, Ichon-shi (KR); Min-Gyu Sung, Ichon-shi (KR); Heung-Jae Cho, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/170,662

(22) Filed: Jun. 28, 2011

(65) Prior Publication Data

US 2011/0256388 A1  Oct. 20, 2011

Related U.S. Application Data

(62) Division of application No. 11/510,709, filed on Aug. 28, 2006, now Pat. No. 7,994,558.

(30) Foreign Application Priority Data

Aug. 29, 2005  (KR) .............................. 2005-0079535

(51) Int. Cl.
*H01L 23/48* (2006.01)
(52) U.S. Cl. ........ 257/764; 257/751; 257/744; 257/770; 438/268; 438/648; 438/683
(58) Field of Classification Search .................. 257/751, 257/764, 766, 770; 438/268, 648, 683
See application file for complete search history.

(56) References Cited

U.S. PATENT DOCUMENTS

| | | | | |
|---|---|---|---|---|
| 5,312,775 A * | 5/1994 | Fujii et al. | ...................... | 438/625 |
| 5,565,708 A * | 10/1996 | Ohsaki et al. | .................. | 257/764 |
| 5,963,828 A * | 10/1999 | Allman et al. | ................. | 438/648 |
| 6,087,259 A * | 7/2000 | Lee | ................... | 438/681 |
| 6,458,693 B1 * | 10/2002 | Park et al. | ...................... | 438/652 |
| 6,503,803 B2 * | 1/2003 | Todorobaru et al. | .......... | 438/296 |
| 7,956,464 B2 * | 6/2011 | Kim et al. | ...................... | 257/751 |
| 2002/0055222 A1 * | 5/2002 | Kim et al. | ...................... | 438/239 |
| 2005/0042829 A1 * | 2/2005 | Kim et al. | ...................... | 438/268 |
| 2005/0110058 A1 * | 5/2005 | Hu | ................. | 257/288 |
| 2007/0026671 A1 * | 2/2007 | Kim et al. | ...................... | 438/648 |

FOREIGN PATENT DOCUMENTS

KR  1998-055960  *  9/1998

OTHER PUBLICATIONS

Machine translation of KR 1998-055960 has been attached.*

* cited by examiner

*Primary Examiner* — Marc Armand
*Assistant Examiner* — Bilkis Jahan
(74) *Attorney, Agent, or Firm* — IP & T Group LLP

(57) ABSTRACT

A semiconductor memory device includes a titanium layer and a titanium nitride layer formed on a substrate, a thin layer formed on the titanium nitride layer, and a metal layer formed on the thin layer, wherein the thin layer increases a grain size of the metal layer.

4 Claims, 8 Drawing Sheets

(A) (B)

SEMICONDUCTOR MEMORY DEVICE

RELATED APPLICATION

This application is a division of U.S. Patent Application Ser. No. 11/510,709 filed on Aug. 28, 2006 now U.S. Pat No. 7,994,558, which claims priority of Korean patent application No. 10-2005-0079535 filed on Aug. 29, 2005. The disclosure of each of the foregoing applications is incorporated herein by reference in its entirety.

TECHNICAL FIELD

The present invention relates to a method for fabricating a semiconductor device, and more particularly, to a method for forming a barrier metal layer of a bit line in a semiconductor memory device.

DESCRIPTION OF RELATED ARTS

Tungsten (W) has been used instead of tungsten silicide ($WSi_x$) to decrease a resistance of a bit line in a typical memory device such as a dynamic random access memory (DRAM). A tungsten bit line may typically utilize a double layer including a titanium nitride layer and a titanium layer as a diffusion barrier metal layer. The double layer may include TiN/Ti or TiN/$TiSi_x$. Employing the diffusion barrier metal layer may reduce the mutual diffusion of tungsten or silicon at a region contacting a substrate, i.e., a silicon substrate or a polysilicon layer. At the same time, a low contact resistance $R_c$ may be obtained.

High speed and low power consuming operations are generally demanded in recent DRAMs, and consequently, a low operation voltage is demanded. Thus, a sensing margin decreases. It is generally known that a parasitic capacitance associated with bit lines and adjacent inter-layer dielectric (ILD) layers has substantial effects on the sensing margin. Thus, various methods have been researched, including a method for forming an ILD layer using a low-k dielectric material and a method for forming bit lines using a metallic material having a low resistance to lower the thickness of bit line stacks.

FIG. 1 illustrates a cross-sectional view to describe a typical method for fabricating a semiconductor memory device. An inter-layer insulation layer 12 is formed over a substrate 11. The substrate 11 includes one selected from a group consisting of a silicon-based substrate structure, a structure including silicide and metal layers for use as a gate, or a structure including polysilicon and epitaxial silicon layers for use as a landing plug contact.

The inter-layer insulation layer 12 and the substrate 11 are selectively etched to form a bit line contact hole BLH exposing a portion of the substrate 11. A bit line is formed over the inter-layer insulation layer 12. The bit line includes a patterned titanium layer 13 and a patterned titanium nitride layer 14 for use as a bit line diffusion barrier metal layer, a patterned bit line tungsten layer 16, and a bit line hard mask 17.

In more detail, a titanium layer and a titanium nitride layer are formed over the inter-layer insulation layer 12 and the bit line contact hole BLH. A thermal treatment is performed thereon to form a titanium silicide layer 15 functioning as an ohmic contact at a contact portion between the titanium layer and the substrate 11. After the titanium silicide layer 15 is formed, a bit line tungsten layer and a bit line hard mask layer are formed over the resultant substrate structure in sequential order. A mask (not shown) for a bit line patterning process is formed over the bit line hard mask layer. The bit line hard mask layer is patterned using the mask to form the bit line hard mask 17. The bit line tungsten layer, the titanium nitride layer, and the titanium layer are patterned using the bit line hard mask 17 as an etch barrier to form the bit line.

Limitations of the typical method are generally occurred when using the diffusion barrier metal layer including the titanium nitride/titanium layer between a tungsten layer and silicon. When a tungsten layer is formed over silicon or oxide, the tungsten layer usually shows a very low resistivity characteristic of 15 $\mu\Omega$cm or lower, similar to a bulk characteristic. However, when the tungsten layer is formed over the titanium nitride layer, a grain size of the tungsten layer often becomes smaller because of a poly-crystalline characteristic of the titanium nitride layer formed below the tungsten layer. Thus, the tungsten layer may have a high resistivity characteristic ranging from 20 $\mu\Omega$cm to 30 $\mu\Omega$cm.

SUMMARY

Consistent with the present invention, a method for fabricating a semiconductor memory device is provided, which can improve an operation characteristic by decreasing a bit line resistance.

Consistent with an embodiment of the present invention, there is provided a semiconductor memory device, including: a titanium layer and a titanium nitride layer formed on a substrate; a thin layer formed on the titanium nitride layer; and a metal layer formed on the thin layer, wherein the thin layer increases a grain size of the metal layer.

Consistent with another embodiment of the present invention, there is provided a method for fabricating a semiconductor memory device, including: sequentially forming a titanium layer and a titanium nitride layer over a substrate; forming a thin layer on the titanium nitride layer; and forming a metal layer on the thin layer, wherein forming the thin layer increases a grain size of the metal layer.

Consistent with still another embodiment of the present invention, there is provided a method for fabricating a semiconductor memory device, including: sequentially forming a titanium layer and a titanium nitride layer over a substrate; doping impurities into the titanium nitride layer to increase a grain size of the titanium nitride layer; and forming a metal layer over the doped titanium nitride layer.

BRIEF DESCRIPTION OF THE DRAWINGS

The above and other features of the present invention will become better understood with respect to the following description of the exemplary embodiments given in conjunction with the accompanying drawings, in which.

DETAILED DESCRIPTION

Figure 1:
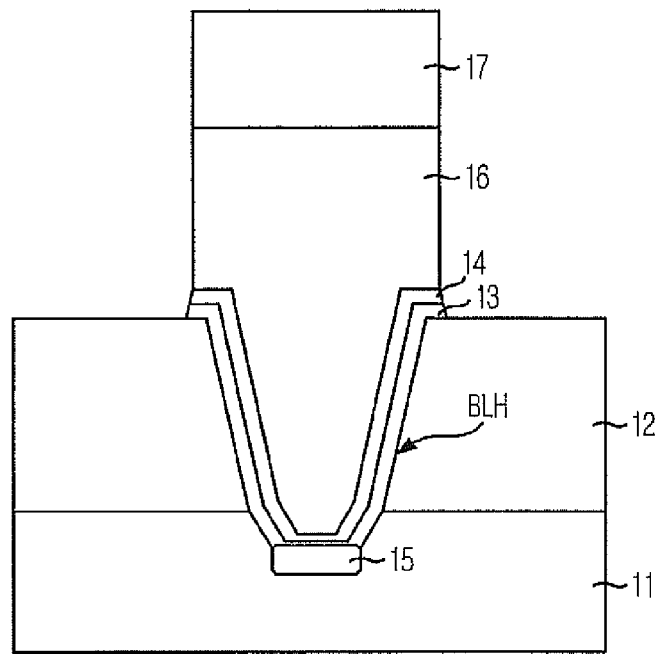
FIG. 1 illustrates a cross-sectional view to describe a typical method for fabricating a semiconductor memory device.

A method for fabricating a semiconductor memory device consistent with embodiments of the present invention will be described in detail with reference to the accompanying drawings. Furthermore, identical reference numerals through out the exemplary embodiments of the present invention represent identical or like elements in different drawings.

Figure 2:
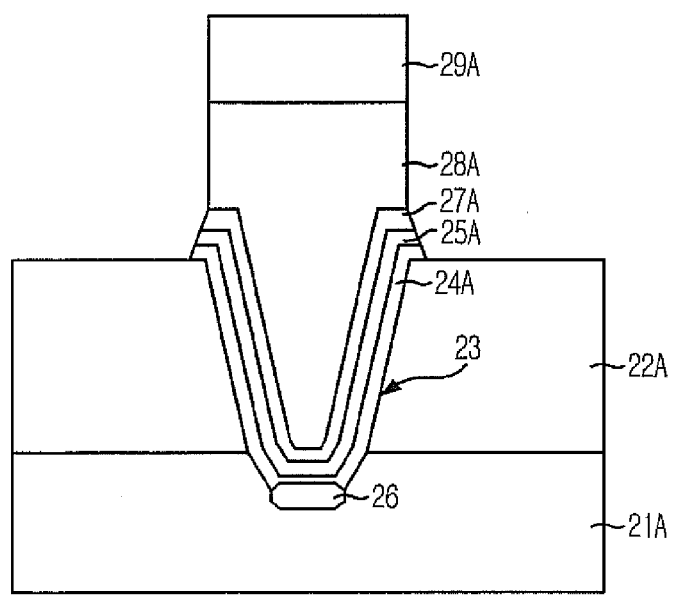
FIG. 2 illustrates a cross-sectional view of a semiconductor memory device consistent with an embodiment of the present invention.

FIG. 2 illustrates a cross-sectional view of a semiconductor memory device consistent with an embodiment of the present invention. A patterned titanium layer 24A, patterned titanium nitride layer 25A, and a patterned thin layer 27A are formed over a patterned substrate 21A. Patterned thin layer 27A is formed to increase a grain size of a subsequently formed metal layer, which may be, for example, a patterned bit line tungsten layer 28A. Patterned bit line tungsten layer 28A and a bit line hard mask 29A are formed over patterned thin layer 27A.

Patterned thin layer 27A includes tungsten silicide and has a thickness ranging from approximately 50 Å to approximately 200 Å. Alternatively, patterned thin layer 27A may include a metal silicide selected from a group consisting of tantalum silicide ($TaSi_x$), titanium silicide ($TiSi_x$), molybdenum silicide ($MoSi_x$), hafnium silicide $HfSi_x$), zirconium silicide ($ZrSi_x$), cobalt silicide ($CoSi_x$), chrome silicide ($CrSi_x$), nickel silicide ($NiSi_x$), tungsten silicon nitride (W—Si—N), tantalum silicon nitride (Ta—Si—N), titanium silicon nitride (Ti—Si—N), molybdenum silicon nitride (Mo—Si—N), hafnium silicon nitride (Hf—Si—N), and zirconium silicon nitride (Zr—Si—N). An amorphous tungsten nitride (WN) layer (not shown) having a thickness ranging from approximately 30 Å to approximately 100 Å may be additionally formed on patterned thin layer 27A.

Patterned bit line tungsten layer 28A functions as a bit line conductive layer. This bit line conductive layer 28A may include a conductive metal selected from a group including tantalum (Ta), titanium (Ti), molybdenum (Mo), hafnium (Hf), cobalt (Co), chrome (Cr), nickel (Ni), platinum (Pt), and ruthenium (Ru).

FIGS. 3A to 3G illustrate cross-sectional views to describe a method for fabricating a semiconductor memory device consistent with an embodiment of the present invention.

Figure 3A:
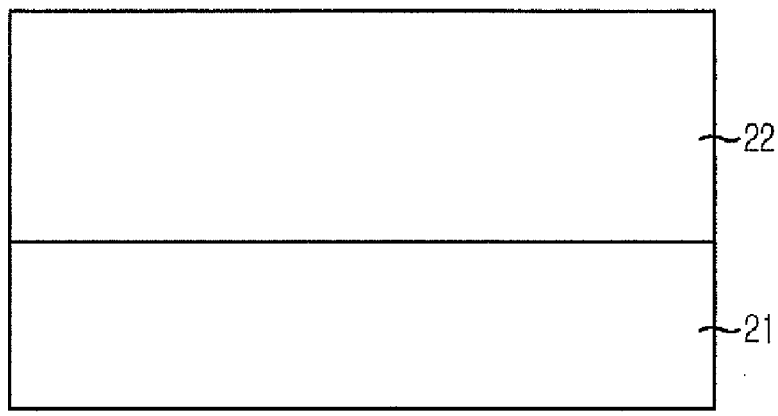
FIGS. 3A to 3G illustrate cross-sectional views to describe a method for fabricating a semiconductor memory device consistent with an embodiment of the present invention.

As shown in FIG. 3A, an inter-layer insulation layer 22 is formed over a substrate 21. Substrate 21 may include a silicon-based substrate structure, a structure including silicide and metal layers for use as a gate, or a structure including polysilicon and epitaxial silicon layers for use as a landing plug contact. Substrate 21 may also include polysilicon germanium according to the formula poly-$Si_{(1-x)}Ge_x$, where x ranges from approximately 0.01 to approximately 0.99.

Inter-layer insulation layer 22 may include an oxide-based layer selected from a group including borosilicate glass (BSG) layer, a borophosphosilicate glass (BPSG) layer, a phosphosilicate glass (PSG) layer, a tetraethyl orthosilicate (TEOS) layer, a high density plasma (HDP) layer, a spin on glass (SOG) layer, and an advanced planarization (APL) layer. Inter-layer insulation layer 22 may also include an inorganic or organic low-k dielectric layer.

Figure 3B:
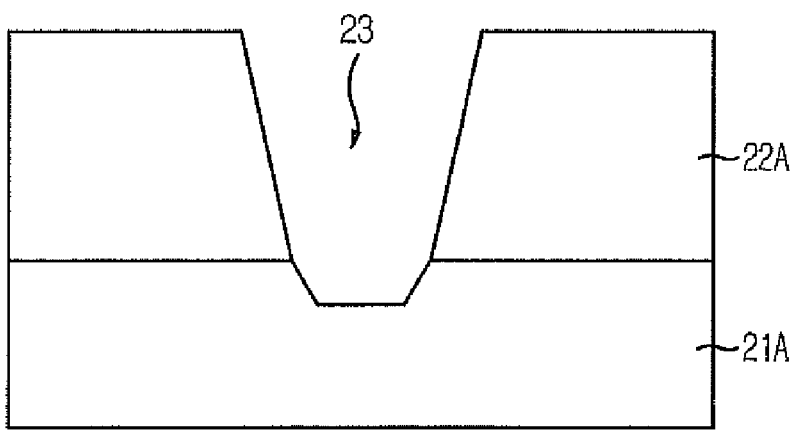

Referring to FIG. 3B, a contact mask (not shown) is formed over a predetermined portion of inter-layer insulation layer 22. Inter-layer insulation layer 22 and substrate 21 are selectively etched using the contact mask as an etch barrier to form a bit line contact hole 23 exposing a portion of substrate 21. Reference numeral 22A denotes a patterned inter-layer insulation layer and reference numeral 21A denotes a patterned substrate.

Figure 3C:
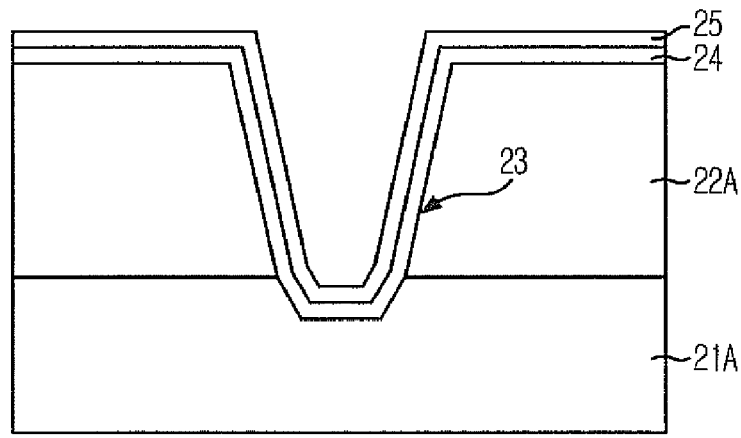

Referring to FIG. 3C, a titanium layer 24 and a titanium nitride layer 25 for use as a bit line diffusion barrier metal layer are formed over patterned inter-layer insulation layer 22A and in bit line contact hole 23.

Figure 3D:
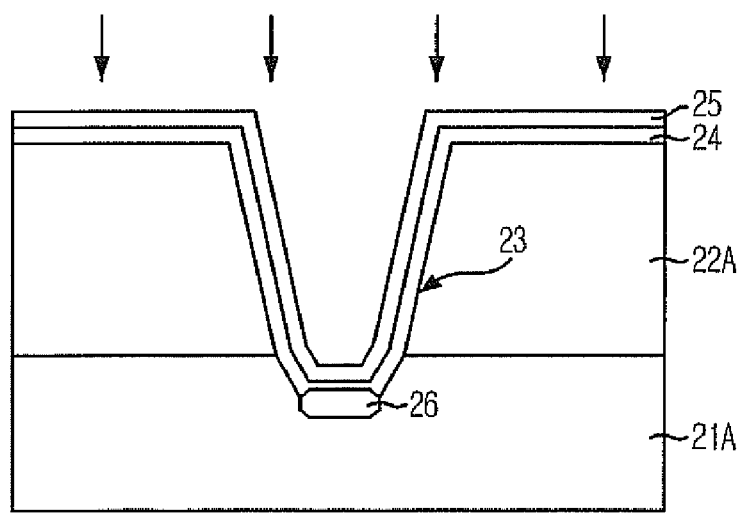

Referring to FIG. 3D, a thermal treatment is performed on the resultant substrate structure at a temperature ranging from approximately 500° C. to approximately 700° C. The thermal treatment is performed to form a titanium silicide ($TiSi_x$) layer 26, where x, representing an atomic ratio of Si to Ti, ranges from approximately 1.5 to approximately 2.5. Titanium silicide layer 26 functions as an ohmic contact at a contact portion between titanium layer 24 and patterned substrate 21A.

Figure 3E:
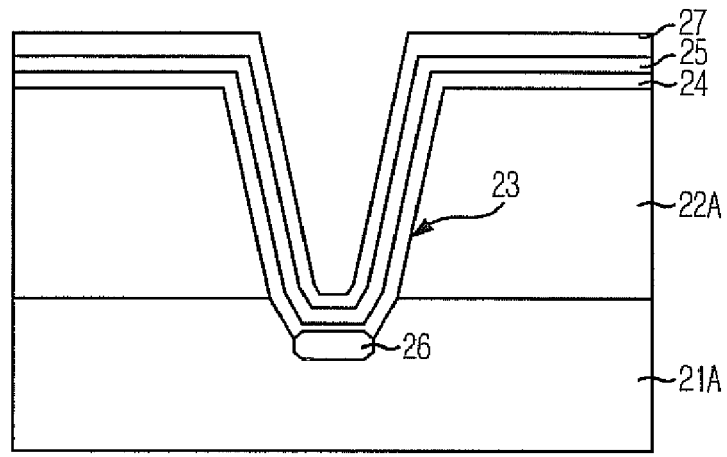

Referring to FIG. 3E, a thin layer 27 including a tungsten silicide ($WSi_x$) layer, where x, representing an atomic ratio of Si to W, ranges from approximately 0.5 to approximately 3.0, is formed over titanium nitride layer 25 after titanium silicide layer 26 is formed. The tungsten silicide layer is an amorphous layer having a thickness ranging from approximately 50 Å to approximately 200 Å. The tungsten silicide layer is formed by employing one of a chemical vapor deposition (CVD) method and an atomic layer deposition (ALD) method.

The tungsten silicide layer is formed between titanium nitride layer 25 and a subsequently formed bit line tungsten layer. This effectively increases a grain size of the bit line tungsten layer, and reduces a sheet resistance of the bit line tungsten layer. Thus, a thickness of the bit line tungsten layer may be decreased, also reducing a parasitic capacitance associated with the bit line and adjacent inter-layer dielectric layers. This may result in the improvement of operational characteristics, such as a sensing margin, and also facilitates the process of patterning the bit line to be performed with less difficulty.

Returning to FIG. 3E, thin layer 27 may include a metal silicide selected from a group including tantalum silicide ($TaSi_x$), titanium silicide ($TiSi_x$), molybdenum silicide ($MoSi_x$), hafnium silicide ($HfSi_x$), zirconium silicide ($ZrSi_x$), cobalt silicide ($CoSi_x$), chrome silicide ($CrSi_x$), nickel silicide ($NiSi_x$), tungsten silicon nitride (W—Si—N), tantalum silicon nitride (Ta—Si—N), titanium silicon nitride (Ti—Si—N), molybdenum silicon nitride (Mo—Si—N), hafnium silicon nitride (Hf—Si—N), and zirconium silicon nitride (Zr—Si—N). An amorphous tungsten nitride (WN) layer (not shown) having a thickness ranging from approximately 30 Å to approximately 100 Å may be additionally formed on thin layer 27.

Figure 3F:
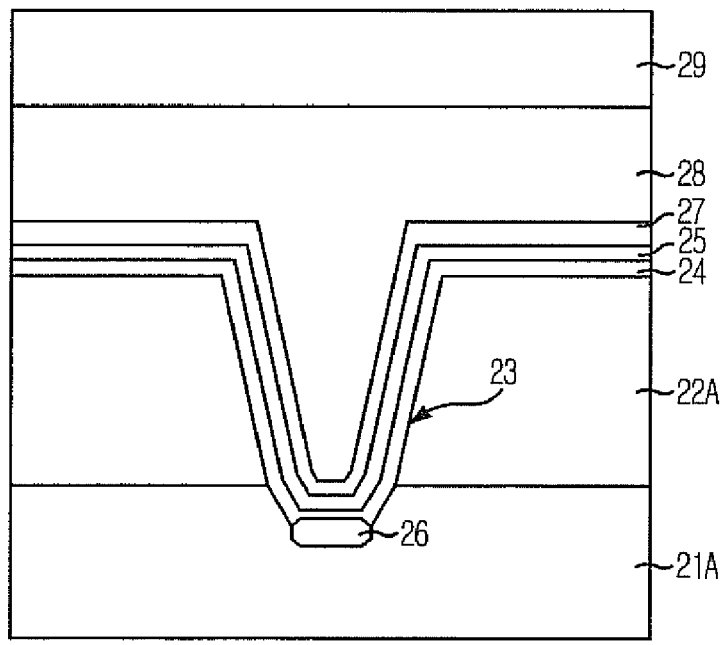

Referring to FIG. 3F, a bit line tungsten layer 28 and a bit line hard mask layer 29 are formed over thin layer 27. Bit line tungsten layer 28 functions as a bit line conductive layer, which may include a conductive metal selected from a group including tantalum (Ta), titanium (Ti), molybdenum (Mo), hafnium (Hf), cobalt (Co), chrome (Cr), nickel (Ni), platinum (Pt), and ruthenium (Ru). Bit line hard mask layer 29 may be formed from a compound selected from a group including a silicon nitride ($Si_3N_4$) layer, a silicon oxide ($SiO_2$) layer, an aluminum oxide ($Al_2O_3$) layer, and a combination thereof.

Figure 3G:
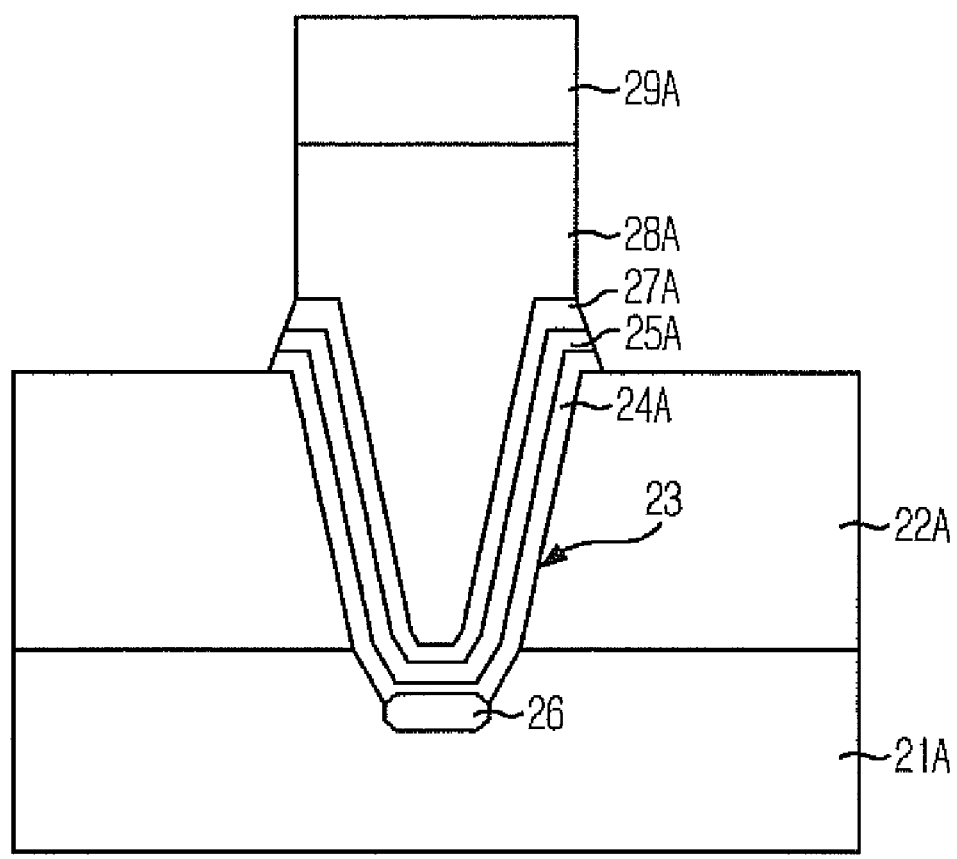

Referring to FIG. 3G, a mask (not shown) is formed over bit line hard mask layer 29. Bit line hard mask layer 29 is then etched using the mask as an etch barrier to form a bit line hard mask 29A. A patterning process is subsequently performed using bit line hard mask 29A as an etch mask to form a bit line including a patterned bit line tungsten layer 28A, a patterned thin layer 27A, a patterned titanium nitride layer 25A, and a patterned titanium layer 24A.

Figure 4:
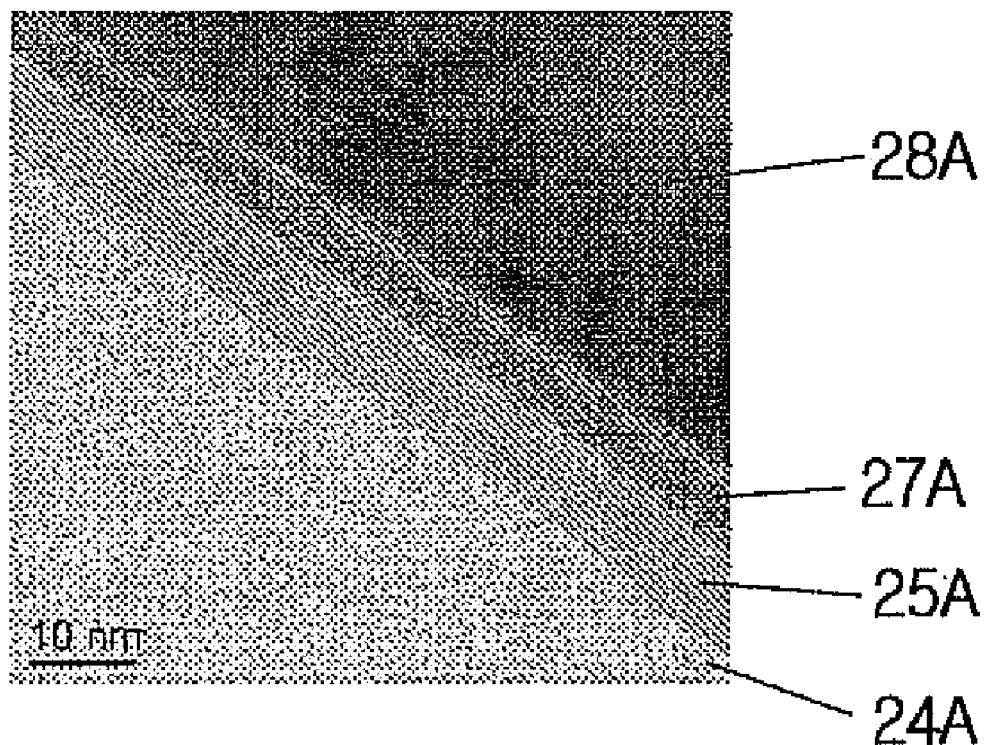
FIG. 4 illustrates a micrographic view of a semiconductor memory device consistent with an embodiment of the present invention.

FIG. 4 illustrates a micrographic view of a semiconductor memory device consistent with an embodiment of the present invention. Patterned bit line tungsten layer 28A; patterned thin layer 27A, patterned titanium nitride layer 25A, and patterned titanium layer 24A are shown in the micrograph formed on a substrate including a silicon substrate or a polysilicon layer, in accordance with the present invention as described above.

Figure 5:
FIG. 5 illustrates micrographic views showing a comparative difference between a typical semiconductor memory device and a semiconductor memory device consistent with an embodiment of the present invention.
Figure 5:
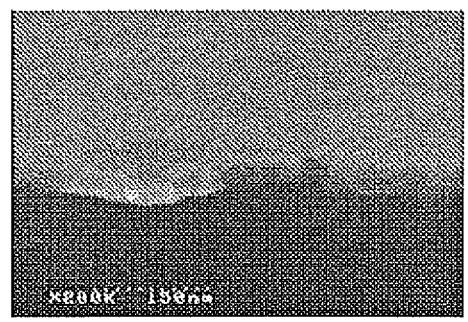

FIG. 5 illustrates micrographic views showing a comparative difference between a typical semiconductor memory device and a semiconductor memory device consistent with an embodiment of the present invention. Specifically, a tungsten layer formed over a titanium nitride/titanium layer will have differing surface morphologies depending on an additional formation of a tungsten silicide layer.

As illustrated in (A), a tungsten layer is formed directly on a titanium nitride/titanium layer according to the typical formation method. A grain size of the tungsten layer is very small, resulting in a rough surface.

As illustrated in (B), consistent with an embodiment of the present invention, a tungsten silicide layer is additionally formed over a titanium nitride/titanium layer, and a tungsten layer is formed over the tungsten silicide layer. When the tungsten silicide layer is formed, a grain size of the tungsten layer increases, resulting in a smooth surface.

Figure 6:
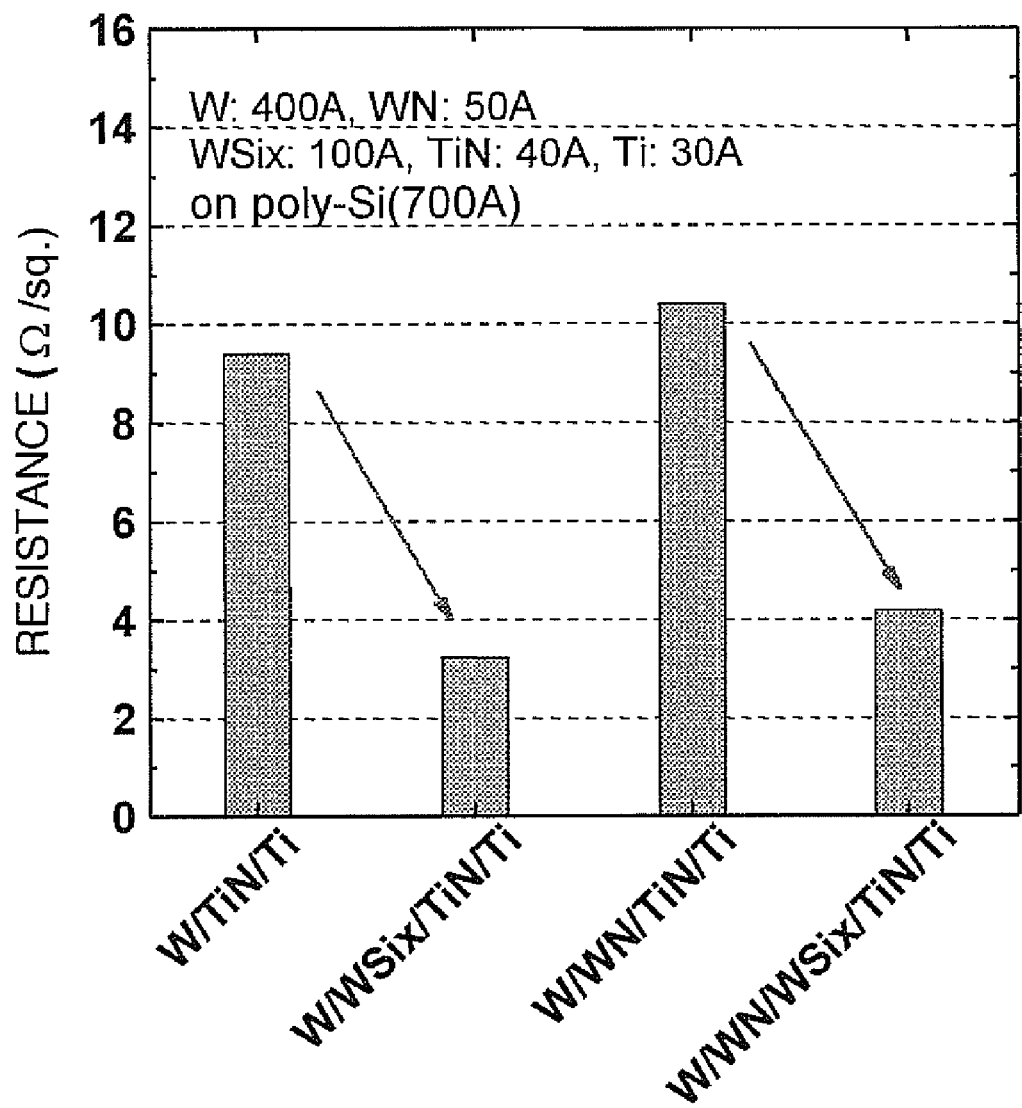
FIG. 6 illustrates a graph showing sheet resistance characteristics of tungsten and tungsten/tungsten nitride layers.

FIG. 6 illustrates a graph showing sheet resistance characteristics of tungsten layers and tungsten/tungsten nitride layers. A contact resistance of a tungsten layer or a tungsten/tungsten nitride layer decreases by more than approximately 50% when a tungsten silicide ($WSi_x$) layer is formed on a titanium nitride/titanium barrier layer.

Consistent with an embodiment of the present invention, the grain size of the bit line tungsten layer may be increased by forming the tungsten silicide layer over the titanium nitride layer and the titanium layer, that is, as a multiple-layered structure of $WSi_x$/TiN/Ti. Using the multiple-layered structure of $WSi_x$/TiN/Ti as the diffusion barrier metal layer in a metal line, such as the bit line, the bit line tungsten layer may have a lower resistance. As a result, the thickness of the bit line tungsten layer may be reduced. The bit line patterning process may be performed easily and advantages may be provided to a subsequent inter-layer dielectric material gap-fill process because the bit line is formed to have a reduced thickness. Furthermore, a device operation speed and a retention time of a memory device may increase due to the reduced parasitic capacitance, improving a refresh of the device.

Consistent with another embodiment of the present invention, impurities such as nitrogen (N), boron (B), phosphorus (P), and arsenic (As) may be doped into a surface of a titanium nitride layer, i.e., a bottom barrier metal layer on which a bit line tungsten layer is formed, to transform the titanium nitride layer into an amorphous layer or increase a grain size of the titanium nitride layer.

The embodiments of the present invention may be applied to bit line formation processes of a memory device as well as other various metal line formation processes. The embodiments of the present invention may be applied to metal line formation processes of semiconductor memory devices such as logic and embedded DRAMs.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
    a titanium layer and a titanium nitride layer formed on a substrate;
    a thin layer formed on the titanium nitride layer;
    a metal layer formed on the thin layer, wherein the thin layer increases a grain size of the metal layer; and
    an amorphous tungsten nitride (WN) layer interposed between the thin layer and the metal layer.

2. The semiconductor memory device of claim 1, wherein the metal layer comprises a tungsten layer, and the thin layer comprises a tungsten silicide layer.

3. The semiconductor memory device of claim 1, wherein the thin layer has a thickness ranging from approximately 50 Å to approximately 200 Å.

4. The semiconductor memory device of claim 1, wherein the metal layer comprises a material selected from a group consisting of tantalum (Ta), titanium (Ti), molybdenum (Mo), hafnium (Hf), cobalt (Co), chrome (Cr), nickel (Ni), platinum (Pt), and ruthenium (Ru).

* * * * *